United States Patent
Holst

(10) Patent No.: US 6,258,642 B1
(45) Date of Patent: Jul. 10, 2001

(54) USE OF FUNCTIONAL MEMORY CELLS AS GUARD CELLS IN A SEMICONDUCTOR MEMORY

(75) Inventor: John Christian Holst, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/315,457

(22) Filed: May 20, 1999

(51) Int. Cl.[7] ............................................. H01L 21/8238
(52) U.S. Cl. ..................... 438/199; 438/256; 438/261; 438/655; 365/51; 365/189; 365/189.5; 365/230
(58) Field of Search ..................................... 438/199, 258, 438/655, 261; 365/189.05, 230, 51, 189

(56) References Cited

U.S. PATENT DOCUMENTS

| | | | |
|---|---|---|---|
| 4,707,218 | * 11/1987 | Giammarco et al. | 156/643 |
| 4,719,602 | 1/1988 | Hag et al. | 365/230 |
| 5,495,445 | 2/1996 | Proebsting | 365/200 |
| 5,646,893 | * 7/1997 | McMinn et al. | 365/189.05 |
| 5,894,448 | * 4/1999 | Amano et al. | 365/230.08 |
| 5,991,197 | * 11/1999 | Ogura et al. | 365/185.11 |
| 5,991,223 | 11/1999 | Kozaru et al. | 365/230.03 |
| 6,074,915 | * 6/2000 | Chen et al. | 438/258 |

OTHER PUBLICATIONS

S. T. Flannagan et al., "8–ns CMOS 64K×4 and 256×1 SRAMK's," IEEE Journal of Solid–State Circuits, vol. 25, No. 5, Oct. 1990, pp. 1049–1054.

D. Draper et al., "Circuit Techniques in a 266–MHz MMX–Enabled Processor," IEEE Journal of Solid–State Circuits, vol. 32, No. 11, Nov. 1997, pp. 1650–1664.

* cited by examiner

*Primary Examiner*—Vu A. Le
*Assistant Examiner*—Pho Luu
(74) *Attorney, Agent, or Firm*—Zagorin, O'Brien & Graham, LLP

(57) ABSTRACT

The memory cells at the very edge of an array are susceptible variations in transistor channel length and other attributes due to lithographic proximity effects. To reduce these undesirable edge effects, it is common to add non-functional sacrificial rows and columns of nearly identical memory cells around the periphery of a memory array. These "guard" cells (i.e., "end" cells, or "edge" cells) may provide, for at least the lower masking layers, a homogeneous lithographic environment at the edge of the functional array, but unfortunately consume area without adding to the storage capacity of the array. To save area, a group of functional memory cells in one array may also be used as guard cells for another memory array. The memory cells of the one array may, for example, be redundant memory cells serving the other memory array. In one embodiment having several memory submodules or banks, an array of four redundant rows is placed adjacent to the array of one of the memory banks. Separate sacrificial guard cells for the adjoining edge of the one memory bank are therefore no longer needed. Nonetheless, the lithographic environment at the edge of the regular array, for at least the lower masking layers, is homogeneous with the environment anywhere in the middle of the regular array. By abutting the redundant and normal memory cell arrays in this matter, the need for sacrificial guard cells for both arrays along their adjoining edges is eliminated, thus saving both layout area and layout complexity.

21 Claims, 6 Drawing Sheets

USE OF FUNCTIONAL MEMORY CELLS AS GUARD CELLS IN A SEMICONDUCTOR MEMORY

BACKGROUND OF THE INVENTION

1. Field of the Invention

The present invention relates to semiconductor memories, and in particular, to organization and layout thereof.

2. Description of the Related Art

In the sub-micron regime of semiconductor lithographic processes, the proximity of adjacent features can have a profound effect on the size and shape of a given feature. A very noticeable effect occurs, for example, in the channel length of a metal-oxide-silicon transistor (i.e., MOS transistor), depending on the spacing to the neighboring polysilicon (i.e. "poly") feature.

In the design of SRAM circuits, it is desirable to have the smallest physical cell possible. An example of a six-transistor memory cell memory cell 10 is shown in FIG. 1. Such a memory cell is useful for static memory arrays such as, for example, cache memories, first-in-first-out buffers (FIFOs) and stand-alone static random access memories (SRAMs). The memory cell 10 includes a pair of cross-coupled N-channel transistors 15, 16 coupling a complementary pair of internal nodes 17, 18 to ground. A pair of cross-coupled P-channel transistors 13, 14 couple the internal nodes 17, 18 to an upper power supply voltage, such as VDD. As shown in FIG. 1, an isolated array power supply VDDMX (i.e., "VDD matrix") may be employed which is separate from the VDD used in other sections of an integrated circuit containing such an array of memory cells. Together, the pair of cross-coupled N-channel transistors 15, 16 and the pair of cross-coupled P-channel transistors 13, 14 form a static flip-flop, which is read and written by way of two N-channel access transistors 11, 12 which respectively couple internal nodes 17, 18 to true and complement bit lines 19, 20 when its word line 21 is selected and driven high.

One of the challenges in making a small SRAM cell is that of cell stability. That is, it must be possible to read the data from the cell without disturbing the data stored in the cell. One of the critical factors in determining cell stability is often referred to as the "Beta" ratio. This is generally thought of as the conductance ratio of the pulldown transistors (transistors 15 and 16) to that of the access transistors (transistors 11 and 12). For the transistor sizing shown in FIG. 1, such a Beta ratio is equal to [(W/L of pulldown transistor)÷(W/L of access transistor)]=[(1.0/0.4)÷(0.7/0.4)]=1.43. The larger the Beta ratio (large pulldown transistors and small access transistors) the more stable the cell.

An additional factor which is crucial to the cell stability is any difference in channel length between the pulldown transistors (transistors 15 and 16), the P-channel pullup transistors (transistors 13 and 14), or the access transistors (transistors 11 and 12). The memory cells at the very edge of an array are susceptible to such variation in channel length due to the lithographic proximity effects already noted. In effect, the transistors on the outside edge of the outermost memory cells (both the last row and the last column of the array) will have gate lengths (as well as other attributes) that are different than the transistors on the inside edge of these cells. These effects contribute to a degradation of the cell stability because the variations in channel length (and other attributes) induce differential offsets in the cell.

To reduce these undesirable edge effects, it is common to add non-functional sacrificial rows and columns of otherwise identical or nearly identical memory cells around the periphery of a memory array. The "word lines" of such sacrificial rows of memory cells are frequently grounded (i.e., connected to the lower power supply, VSS), and the "bit lines" of such sacrificial columns of memory cells are frequently connected to the upper power supply (e.g., VDD). By adding these sacrificial cells, all of the data-storing cells in the array (including those at the edges of the array) are contained in a lithographically homogeneous environment. Consequently, variations in channel length and other attributes are reduced, and memory cell stability is enhanced. However, these sacrificial "guard" cells add to the array area without increasing the storage capacity of the array. Improved techniques for reducing these memory array edge effects are desirable.

SUMMARY OF THE INVENTION

To save area, a group of functional memory cells in one array may also be used as guard cells for another memory array. The memory cells of the one array may, for example, be redundant memory cells serving the other memory array. In one embodiment having several memory submodules or banks, an array of four redundant rows is placed adjacent to the array of one of the memory banks. Separate sacrificial guard cells for the adjoining edge of the one memory bank are therefore no longer needed, and the area consumed by such guard cells is eliminated. In another embodiment, a portion of a functional array also services as guard cells for the remaining portion of the array. In each case, all masking layers which together define the transistors within the memory cells are identical between the functional cells which also serve as guard cells and the regular array memory cells. Thus, the lithographic environment at the edge of the regular rows, for at least the lower masking layers, is homogeneous with the environment anywhere in the middle of the array of regular memory cells. By abutting the redundant and normal memory cell arrays in this matter, we have eliminated the need for sacrificial guard cells (or "edge cells" or "end cells") for both arrays along their adjoining edges, saving both layout area and layout complexity. In other embodiments, redundant columns may also serve as guard cells.

In one embodiment of the invention, a semiconductor integrated circuit includes a first functional array of memory cells, and a second functional array of memory cells positioned adjacent to one edge of the first array. The memory cells of the second array also serve as guard cells for the memory cells of the first array along the one edge of the first array. The integrated circuit may include a plurality of guard cells adjacent to at least one of three remaining edges of the first memory array. The memory cells of the second array may be stepped to form, for at least a subset of lithographic layers of the semiconductor process, an unbroken homogeneous lithographic array with the memory cells of the first array. The subset of lithographic layers may include layers which together define transistors within the memory cells, may include at least one polysilicon layer and at least one active area layer, and may include all layers below and including a first metal layer. In some embodiments, the second array may provide redundant memory cells organized as redundant rows for the first array. The second array may share local bit lines in common with the first array, or may include local bit lines which are disjoint from local bit lines within the first array. Bit line circuits for the local bit lines within the first array may be located on an opposite side of the collective first and second arrays as bit line circuits for the local bit lines within the second array.

In another embodiment of the invention, a semiconductor integrated circuit includes an array of memory cells surrounded on three sides by guard cells. A group of addressable memory cells located along a fourth side of the array function as guard cells for remaining memory cells of the array. The group of addressable memory cells may be organized as redundant rows for the remainder of the array, and may share bit lines in common with the remainder of the array, or may include bit lines which are disjoint from bit lines within the remainder of the array. Bit line circuits for the bit lines serving the group of addressable memory cells may be located on an opposite side of the array as bit line circuits serving the remaining memory cells of the array. The group of addressable memory cells may also be organized as redundant columns for the remainder of the array, and may share word lines in common with the remainder of the array.

In a method embodiment of the invention suitable for a semiconductor integrated circuit, a method of reducing lithographic variation between perimeter memory cells of a memory array and interior memory cells of the array, while reducing required overhead area, includes abutting an array of redundant memory cells next to at least one side of the memory array in place of dedicated non-functional sacrificial guard cells. The array of redundant memory cells may provide redundant rows for the array of memory cells. In some embodiments the method further includes allocating redundant memory cells nearer to the memory array before those further away from the memory array, and may also include abutting an array of guard cells adjacent to three remaining sides of the array of memory cells.

In yet another embodiment of the invention, a semiconductor integrated circuit includes upper and lower groups of submodules, where each submodule includes an array of memory cells coupled by local bit lines to primary sense amps. The integrated circuit further includes disjoint upper and lower global bit-line pairs, the upper global bit-line pairs spanning the upper group of submodules and the lower global bit-line pairs spanning the lower group of submodules, the primary sense amps coupled to drive a differential signal onto corresponding of the upper or lower global bit-line pairs. Secondary sense amps are placed between the upper and lower groups of submodules, upper ones of the secondary sense amps coupled to corresponding of the upper global bit-line pairs, and lower ones of the secondary sense amps coupled to corresponding of the lower global bit-line pairs. A lowermost submodule of the upper group also serves as guard cells for at least one of remaining submodules of the upper group, and an uppermost submodule of the lower group also serves as guard cells for at least one of remaining submodules of the lower group. The lowermost submodule of the upper group may include redundant word lines for the remaining submodules of the upper group, and the uppermost submodule of the lower group may include redundant word lines for the remaining submodules of the lower group. In certain embodiments the integrated circuit further includes a processor core coupled to access the data stored in the submodules to define an integrated circuit microprocessor with a defect tolerant memory array formed thereon, which may be an L2 cache.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 2:
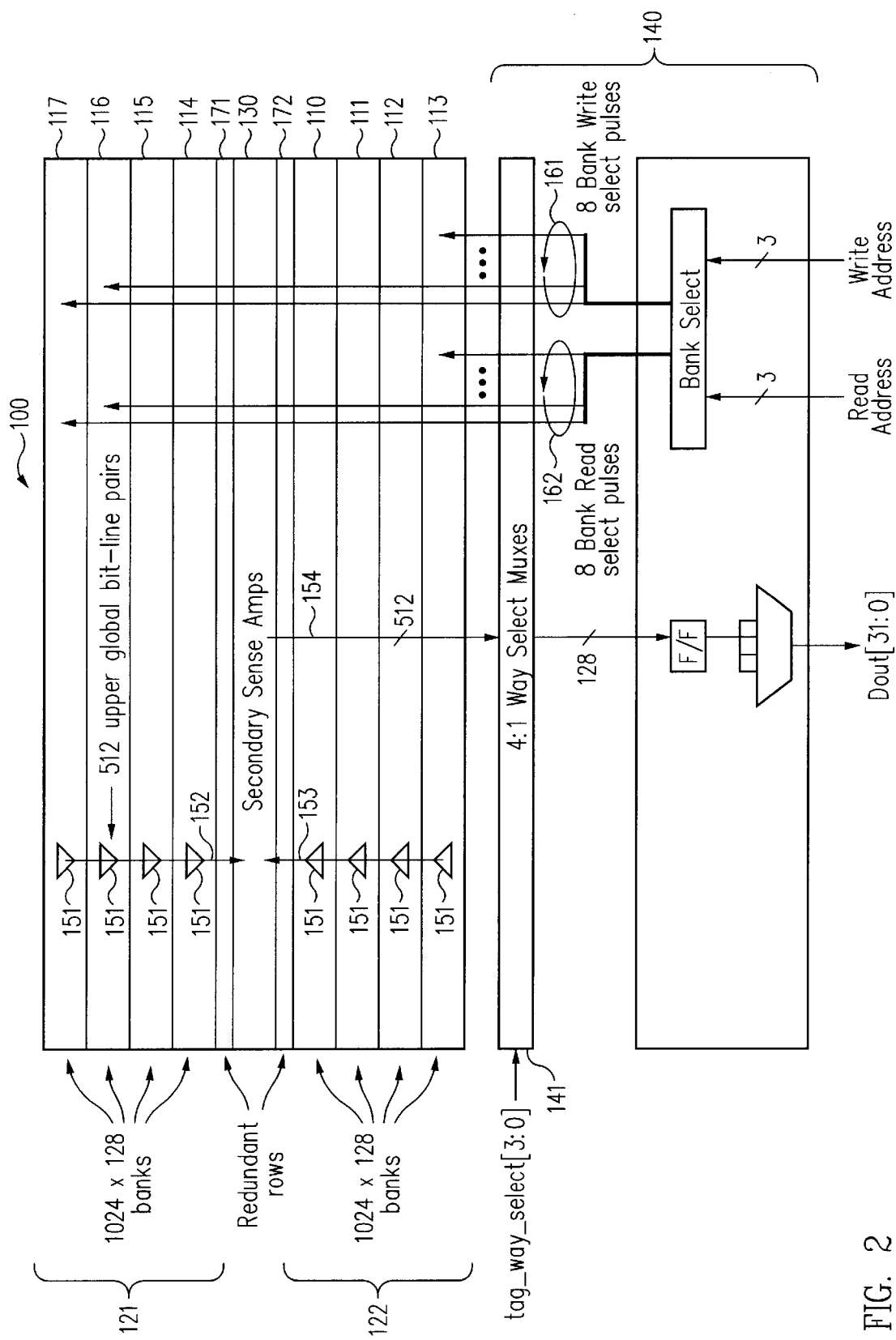
FIG. 2 depicts a layout of an eight (8) submodule memory module in accordance with an exemplary embodiment of the present invention.

FIG. 2 depicts the organization and layout of a memory module 100 in accordance with an exemplary embodiment of the present invention. Eight submodules or banks 110, 111, 112, 113, 114, 115, 116 and 117 are organized into upper and lower groups 121 and 122. In the embodiment of FIG. 2, these submodules are substantially identical and each includes an array of memory cells; word line drivers and word line decoders (i.e., row circuits); column decoders, primary sense amplifiers, write drivers, equilibrate circuits (bit line circuits); and control circuitry (all not shown). In this regard, the submodules are conventional and, based on the description herein, a variety of suitable configurations will be appreciated by persons of ordinary skill in the art.

Secondary sense amplifiers 130 are positioned toward the center of the memory module 100 between upper and lower groups 121 and 122 of submodules. Top-level control, I/O, way-select multiplexers and other logic (shown collectively as logic 140) are positioned toward a periphery of memory module 100. Two submodules 171 and 172 organized as redundant rows of memory cells are located adjacent to the secondary sense amplifiers 130. Selection circuitry (not shown) may be programmed to assign a particular redundant row to the address of, and thereby replace, a defective row. In the configuration shown in FIG. 2, redundant rows within submodule 171 may be configured to replace defective rows in any of the upper group 121 of submodules, while redundant rows within submodule 172 may be configured to replace defective rows in any of the lower group 122 of submodules.

Redundant row selection is circuitry is conventional, and in general, may be provided using any of a number of suitable techniques, including volatile and non-volatile storage of defective row addresses. In one configuration, the selection circuitry includes a dedicated comparator circuit for each redundant row, which compares its programmed address with the row address of each read and write access to the memory module 100. When a comparator detects a match between the programmed address and a read or write address, the word line of the corresponding redundant row is activated.

In the later described embodiment of FIG. 6, logic 140 receives read and write addresses and supplies bank select pulses (on lines 162 and 161, respectively) to corresponding submodules of memory module 100 based on the upper address bits of the read or write address (e.g., RA[15:13] or WA[15:13]). Remaining address bits are used for word line select, column select and way select. In the case of read access, word line selection (based on RA[12:6]) and 2:1 column multiplexing (based on RA[5]) are performed at the submodule level, whereas way selection is performed at way select multiplexers 141. As a result, each submodule 110, 111, 112, 113, 114, 115, 116 and 117 includes 128 word lines and 1024 columns multiplexed (2:1) onto 512 primary sense amplifiers 151. Each redundant submodule 171, 172 includes 4 word lines and 1024 columns multiplexed (2:1) onto 512 primary sense amplifiers (not shown in FIG. 2). In the case of write access, write way selection decode occurs within the submodules.

Although other topologies are possible and the above-described read and write topology is merely exemplary, the description that follows is based on the exemplary topology for specificity of description. Nonetheless, embodiments in accordance with the present invention are not limited to the exemplary topology. Based on the description herein, persons of ordinary skill in the art will appreciate a wide variety of suitable array topologies that may fall within the scope of claims that follow.

Referring again to FIG. 2, local bit-line pairs (not shown) span the corresponding submodule, and corresponding primary sense amplifiers 151 supply differential signals on global bit-line pairs (e.g., upper global bit-line pairs 152 and lower global bit-line pairs 153). Four corresponding primary sense amplifiers 151 of upper group 121 of submodules supply differential signals on each of 512 corresponding upper global bit-line pairs 152. Similarly, four corresponding primary sense amplifiers 151 of lower group 122 of submodules supply differential signals on each of 512 corresponding lower global bit-line pairs 153. An upper secondary sense amplifier (not shown in FIG. 2) of secondary sense amplifiers 130 is coupled to a respective one of the upper global bit-line pairs 152 and a lower secondary sense amplifier (not shown in FIG. 2) of secondary sense amplifiers 130 is coupled to a respective one of the lower global bit-line pairs 153. Outputs of corresponding upper and lower secondary sense amplifiers are driven onto a corresponding one of 512 different output signal paths 154.

For ease of illustration, only single ones of the 512 upper global bit-line pairs 152, lower global bit-line pairs 153 and output signal paths 154 are depicted in FIG. 2. Orientations of sense amplifiers are illustrative of overall direction of signal flows; however, lower level organization of memory module 100 will be better understood in the context of FIG. 3, as well as the configuration of the redundant submodules 171, 172.

Figure 3:
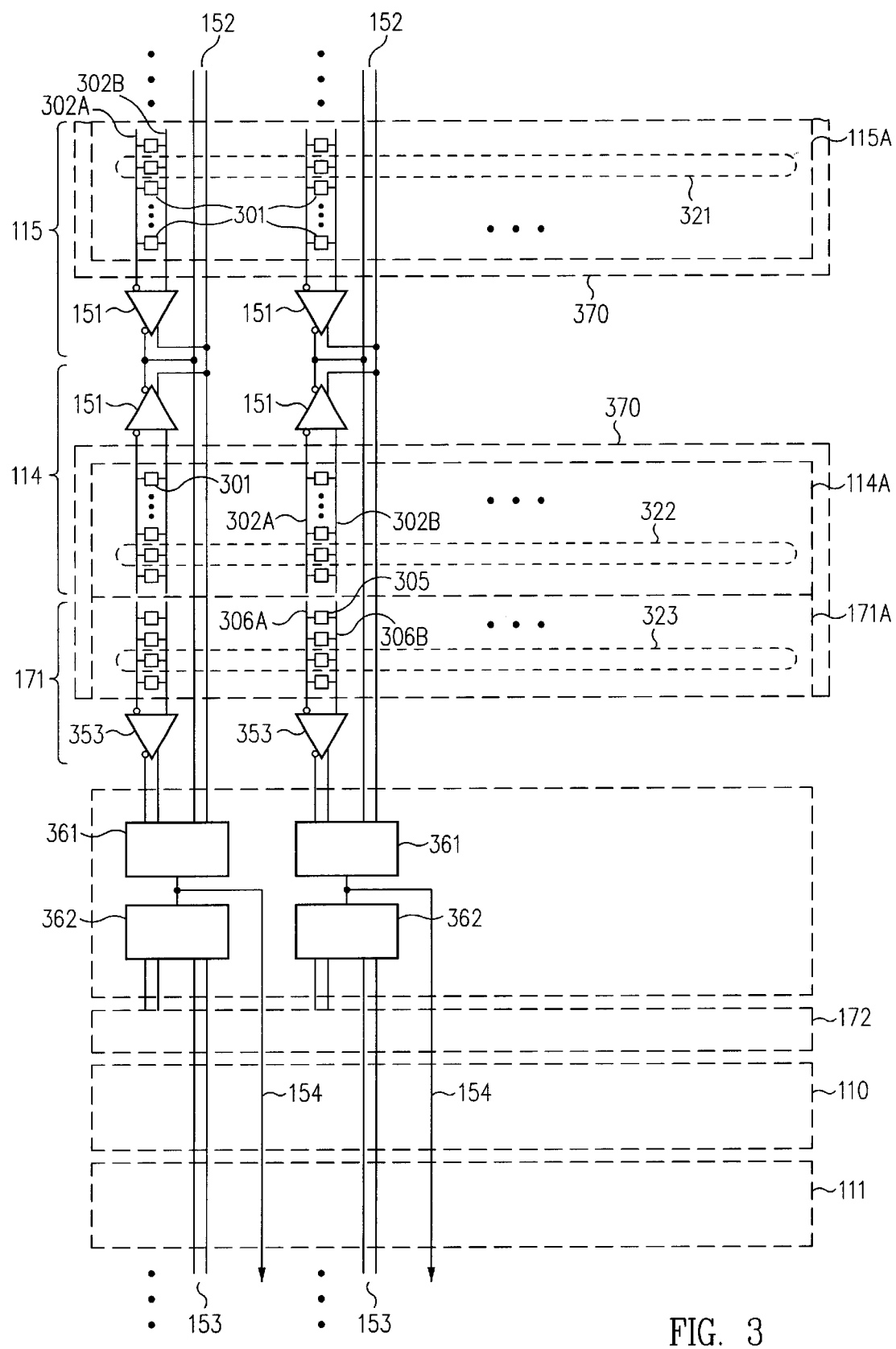
FIG. 3 illustrates additional aspects, including guard cell configuration, of the exemplary memory module organization depicted in FIG. 2.

FIG. 3 illustrates additional details of the array layout configuration, and also illustrates the data path from representative memory cells and representative redundant memory cells toward data line outputs via primary and secondary sense amplifiers. Two submodules 115 and 114 of upper group 121 and corresponding redundant submodule 171 are illustrated, and with lesser detail, two submodules 110 and 111 of lower group 122 and corresponding redundant submodule 172 are also illustrated. Submodules 115 and 114 (as well as those not shown) each include a respective array of memory cells 115A, 114A organized as rows and columns. Upon word-line activation, data on each of the local bit lines (e.g., 302A, 302B) is sensed by the associated primary sense amplifier 151 and driven onto an associated global bit-line 152. Each global bit-line 152 is in turn sensed by an associated secondary sense amplifier 361 whose outputs are driven onto an associated data line 154.

The four redundant rows (i.e., redundant array 171A) of redundant submodule 171 allow memory module 100 to tolerate up to four defective rows (i.e., up to four rows each having at least one defective memory cell or other row defect). Larger numbers of redundant rows may be implemented and would allow memory module 100 to tolerate larger numbers of defects. As described above, selection circuitry of any of a variety of suitable configurations supplies a redundant word-line activation upon presentation of a read or write corresponding to a defective row. For example, when a comparator detects a match between a defective address and a read or write address, the word line of a redundant row (e.g., redundant row 323) is activated. Upon redundant word-line activation, data on each of the local bit lines (e.g., local bit lines 306A, 306B) is sensed by an associated redundant primary sense amplifier 353 and provided to an associated secondary sense amplifier 361. The output of redundant primary sense amplifiers 353 overpowers the data supplied on global bit-lines 152, as is described in greater detail in a co-pending patent application entitled "Redundancy Circuit and Method for Semiconductor Memory," application Ser. No. 09/315,458 naming John C. Holst as inventor and filed on even date herewith, the entirety of which is incorporated herein by reference.

To simplify the above description, a 2:1 column multiplexing configuration previously described is not shown in FIG. 3. However, multiplexing may be employed if desired.

Primary sense amplifiers 151 are input coupled to memory cells (e.g., memory cells 301) via complementary local bit-lines (e.g., local bit-lines 302A and 302B) and output coupled to corresponding ones of secondary sense amplifiers 361 (or 362) via corresponding ones of global bit-lines 152 (or 153). Global bit-lines 152 and global bit-lines 153 are relatively long, capacitive lines long, each spanning four submodules or banks of memory module 100. During a read cycle, primary sense amplifiers 151 of an activated submodule drive a low-voltage-swing differential signal onto the corresponding global bit-lines. Suitable designs for primary sense amplifiers 151 are therefore influenced by delay and fanout considerations.

Memory cells of normal rows (e.g., memory cells 301) and of redundant rows (e.g., memory cells 305) are substantially identical. Primary sense amplifiers 151 and redundant primary sense amplifiers 353 are of any of a variety of suitable designs. An advantageous primary sense amplifier configuration is described in greater detail in a co-pending patent application entitled, "Semiconductor Memory Organization," application Ser. No. 09/315,459 naming John C. Holst as inventor and filed on even date herewith, the entirety of which is incorporated herein by reference. Secondary sense amplifiers 361, 362 are of any of a variety of suitable designs. An advantageous secondary sense amplifier configuration, as well as additional details of the data path illustrated in FIG. 3, are described in greater detail in the co-pending patent application entitled, "Redundancy Circuit and Method for Semiconductor Memory," already incorporated by reference.

As shown in FIG. 3, the bit line circuits associated with array 114A and redundant array 171A are located on opposite sides of the collective arrays 114A and 171A. For example, the primary sense amplifiers 151 are located along the top of their associated array 114A, while the redundant primary sense amplifiers 353 are located along the bottom of their associated array 171A. The local bit lines within the array 114A (e.g., 302A, 302B) are disjoint (e.g., non-contiguous) with the local bit lines (e.g., 306A, 306B) within the redundant array 171A.

The top, left, and right sides of array 114A are surrounded by sacrificial guard cells 370 (also sometimes called "edge cells" or "end cells"). Such guard cells are identical to the memory cells of array 114A at least for all lower masking (lithographic) layers up through the first metal layer (i.e., Metal1) at least for this embodiment. In particular, the layers which together form MOS transistors within the guard cells 370 are identical with the regular memory cells. To save area, the memory cells in the redundant array 171A are also used as guard cells for the array 114A. Thus, the lithographic environment at the edge of the normal rows within array 114A for all layers up through Metal1 is identical to the environment anywhere in the middle of the array 114A. One difference that distinguishes the memory cells within the "normal" array 114A from the memory cells within the "redundant" array 171A is that the local bit lines, which are implemented in vertical Metal2 lines, are disjoint between the two arrays. By abutting the redundant and normal memory cell arrays in this matter, the need for sacrificial guard cells along the abutting edge, for both arrays, has been eliminated. This saves both layout area and layout complexity. In other embodiments, an array of redundant columns may also be used as end cells.

In the example shown, the redundant array 171A may serve as guard cells for the regular array 114A because the sensitivity to variations in the redundant memory cells is frequently less severe than for regular memory cells. For example, the local bit lines in the redundant array 171A are much shorter, and may be discharged during a read cycle to a much lower voltage, than the local bit lines within the regular array 114A. Moreover, many of the redundant rows may not be activated for many devices, in which case the memory cells of such a non-enabled redundant row (e.g., having its word line permanently held to ground by a non-enabled redundant row decoder) act very much like "perfect" guard cells. If the redundant row nearest the regular array is allocated first, then remaining redundant rows still function purely as guard cells. Until the last redundant row is allocated, at least one non-enabled redundant row remains whose memory cells serve purely as guard cells.

Figure 1:
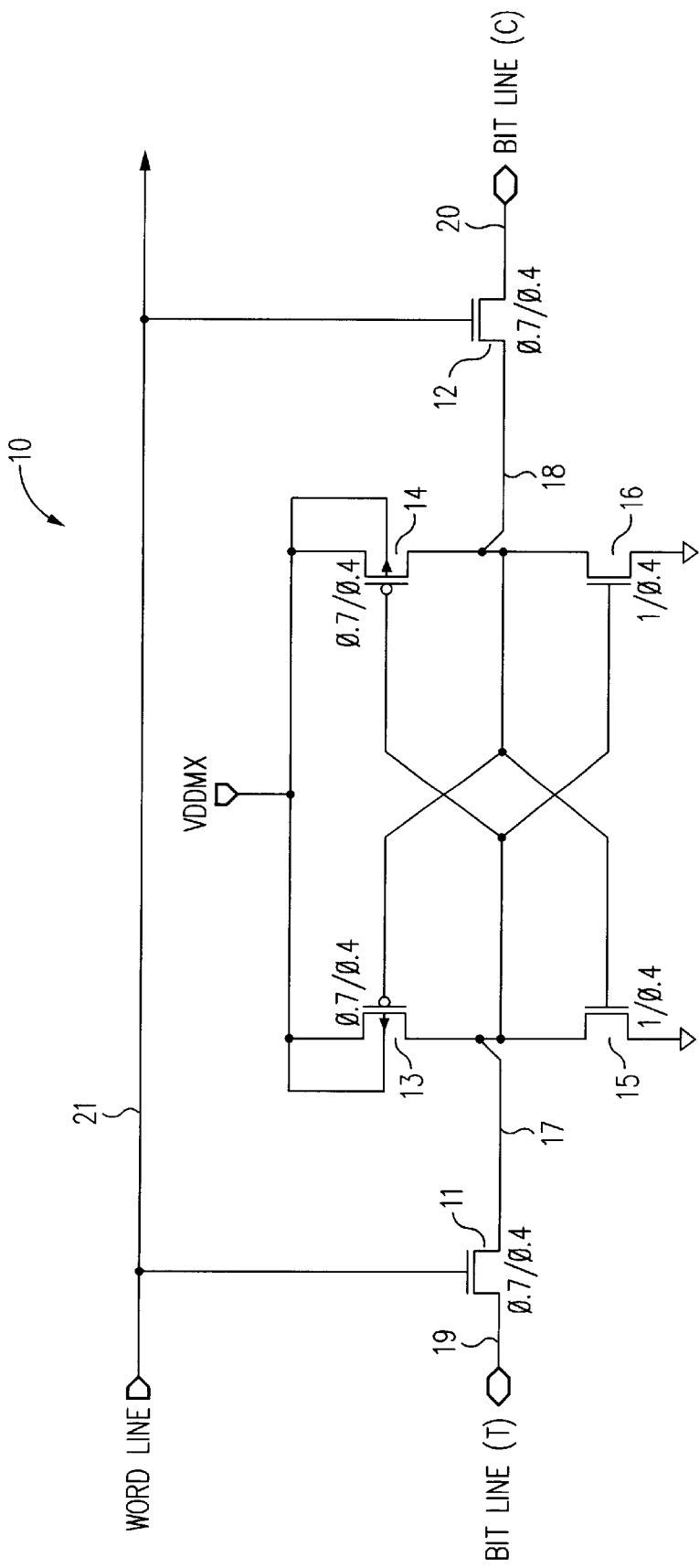
FIG. 1 labeled prior art, is a schematic diagram of a six-transistor static memory cell.
Figure 4:
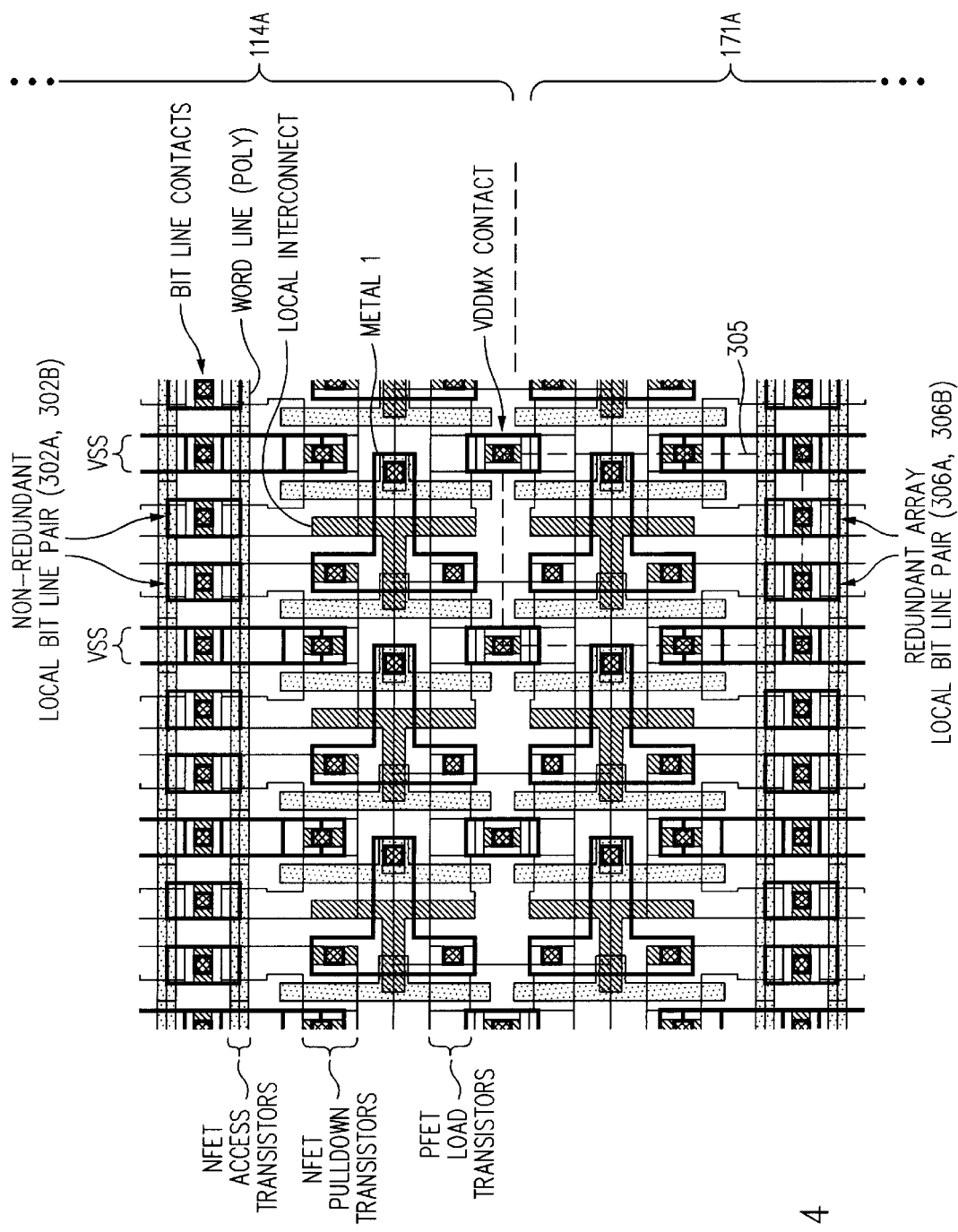
FIG. 4 is a layout diagram of the interface between a redundant array and an adjacent non-redundant array shown in FIG. 3.

In one semiconductor integrated circuit realization of a processor including a memory array (L2 cache) configuration in accordance with the present invention, five layers of aluminum are used in addition to a tungsten local interconnect (LI) layer. FIG. 4 is a layout diagram illustrating several lower lithographic masking layers along the interface between the non-redundant array 114A and the redundant array 171A. In the figure, which shows layers up through the first metal layer (i.e., "Metal1"), several memory cells of the bottom row of memory cells within array 114A are shown, as are several memory cells of the top row of memory cells within redundant array 171A. The circuit configuration and transistor sizing for each memory cell is accordance with that shown in FIG. 1.

Several of the prominent features are identified in the figure. A redundant memory cell 305 is labeled which forms part of the upper-most redundant row. Such a memory cell may be observed to be identical to the other memory cells shown in the figure. The use of both LI and Metal1 facilitates a 9.84 $\mu m^2$ cell size. The individual N-channel pulldown transistors, N-channel access transistors, and P-channel load transistors of the memory cells (each of which, of course, is lithographically defined by the intersection of an active area layer and a polysilicon layer) are each arranged in horizontal rows, as labeled in the figure. The word lines traverse horizontally in polysilicon, and are periodically strapped in an upper layer of metal, such as Metal3 (not shown).

Local bit-lines, which span 128 memory cells within a non-redundant submodule, are vertically routed in Metal2 (not shown). The local bit lines 302A, 302B within the array 114A connect to Metal1 pads previously connected to a shared source/drain contact for two adjacent access transistors. Similarly, local bit lines 306A, 306B within the redundant array 171A connect to Metal1 pads previously connected to a shared source/drain contact for two adjacent access transistors of redundant memory cells, such as memory cell 305 shown. Within each array, the respective Metal2 local bit lines traverse vertically above each memory cell across the entire array. However, since the local bit lines are disjoint across the boundary between array 114A and 171A, the Metal2 local bit lines within each array stop at the last bit line contact, and neither crosses the boundary between the arrays. However, all other layers up to Metal1 are identical in both arrays. Consequently, the array 114A and the redundant array 171A together form a homogeneous lithographic array insofar as the lower masking layers are concerned. For this embodiment, the only thing that distinguishes the "normal" array 114A from the "redundant" array 171A is that the Metal2 lines (e.g., local bit lines) are disjoint between the arrays.

The global bit-lines (e.g., global bit-lines 152 and global bit-lines 153), which span four submodules, are vertically routed in Metal 4. Metal 4 power supply wires are used to shield the global bit-lines from the write data inputs, which are also routed to each of the banks in Metal 4. Metal 5 runs perpendicular to the Metal 4 shielding wires to complete a power grid and to connect to C4 solder balls. In one semiconductor integrated circuit realization, solder balls are not positioned over the memory cell arrays to prevent alpha particle-included soft errors; however, C4 solder balls are used over the sense amplifier and word line driver areas of the memory module. In particular, the back-to-back placement of the submodules (shown, for example, in FIG. 3) results in a larger area between every other submodule to accommodate the two rows of primary sense amplifiers 151 (and other circuits) which allows C4 solder bumps to fit thereabove without extending over nearby memory cells.

Figure 5:
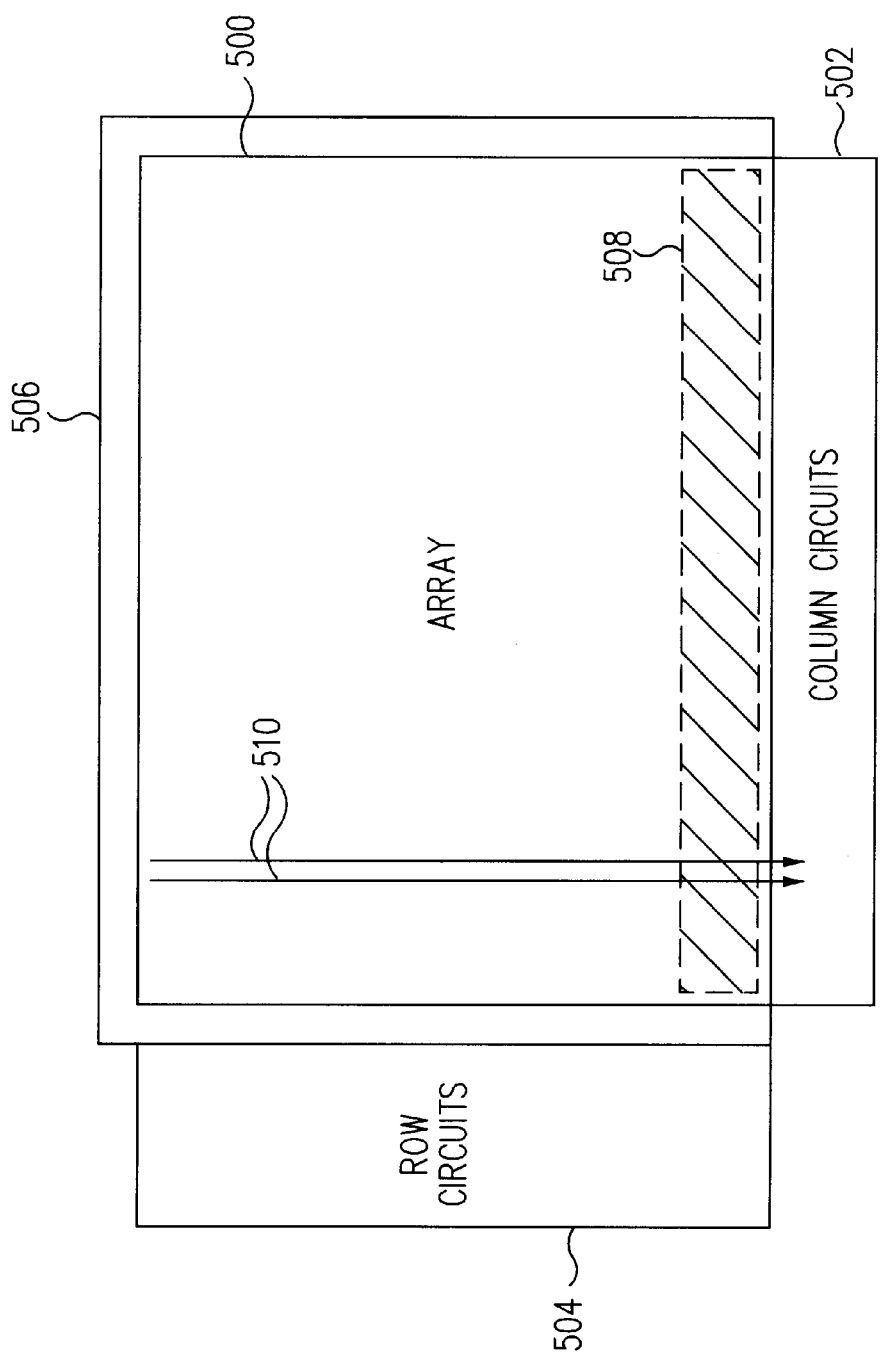
FIG. 5 is a block diagram of another embodiment of the present invention showing a portion of a functional array also serving as guard cells for the remainder of the array.

Another embodiment of the present invention is illustrated in FIG. 5. An array 500 includes a functional portion 508 which includes addressable memory cells, such as, for example, several redundant rows of memory cells. The remaining portion of array 500 also includes addressable memory cells such as, for example, non-redundant memory cells. An exemplary pair of complementary bit lines 510 is shown spanning the entire array 500, including both the array portion 508 and the remaining portion of the array 500. Column circuits 502 (i.e., bit line circuits) which may include sense amplifiers, decoders, precharge and equilibration circuits, and other support circuitry, is located for this embodiment adjacent to the bottom edge of the array 500. Row circuits 504 (i.e., word line circuits) which may include predecoders, decoders, word line drivers, and other support circuitry, is located adjacent to the left side of array 500.

The bit lines (such as bit lines 510) are coupled to memory cells in both the array portion 508 and to memory cells in the remaining portion of the array 500. In other embodiments (not shown), some of the column circuits may be located adjacent to the top edge of array 500 while others of the column circuits are located adjacent to the bottom edge of the array 500. In each case, the memory cells of the array portion 508 also serve as guard cells for the remaining portion of array 500 along its bottom edge, while sacrificial guard cells 506 are implemented along the three other edges of array 500 (e.g., along the top, left, and right sides of array 500). The lithographic environment through the interface between the array 500 and the array portion 508 is a homogeneous lithographic array, for this embodiment, for all masking layers (since the bit lines are shared across the interface).

Processors, Integrated Circuit and System Embodiments

Figure 6:
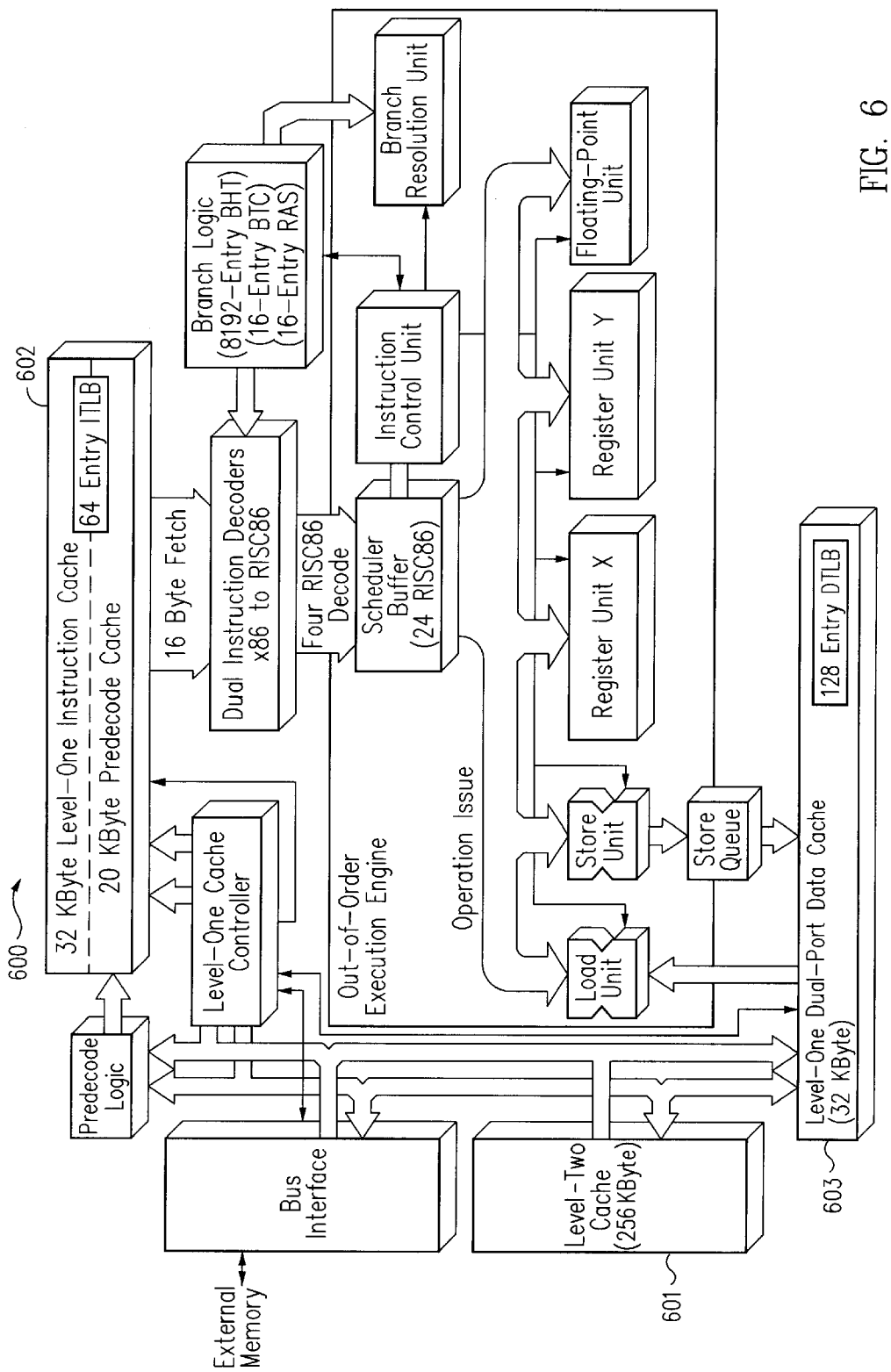
FIG. 6 is a block diagram illustrating an integrated circuit microprocessor architecture including a memory array in accordance with an exemplary embodiment of the present invention as illustrated in FIG. 3.

FIG. 6 depicts an exemplary 400 MHz superscalar X86 processor 600 that includes an on-chip backside full-speed 256 KB level-2 (L2) write-back cache with on-chip tags. L2 cache 601 is organized as described above with a row-based redundancy scheme in which the redundant memory cells also serve as guard cells for the non-redundant array. In an exemplary configuration, eight redundant rows are provided to replace up to four defective rows in any single submodule or bank. The part includes upper and lower portions and a given redundant row may replace a defective row in any one of the four banks (of a corresponding upper or lower portion) representing distinct sets of rows. Other configurations are possible and, based on the description herein, will be appreciated by persons of ordinary skill in the art.

In an exemplary embodiment, L2 cache 601 is logically organized as a four-way set-associative unified cache with 1K sets and a 64-byte line size. Each line is further divided into two 32-byte blocks. A true least-recently used replacement policy is supported. The LRU information for each set (2 bits per way) is stored in L2 tag RAM. L2 cache 601 uses the MESI protocol to maintain coherency with the level-1 (L1) instruction and data caches (602 and 603) and external memory. Other implementations in accordance with the present invention may use different cache organizations and may be configured with differing memory hierarchies.

L2 cache 601 runs at a processor clock frequency, and can simultaneously perform one read and one write operation in each clock cycle. To support this functionality, internal portions of the data and tag RAMs run at twice the clock frequency. Compared to an external front-side 100 MHz L2 cache, the on-chip L2 cache 601 provides eight times the bandwidth on a 400 MHz CPU, since it uses separate 64-bit buses for read and write operations. Block read and write latency/throughput for L2 cache 601 is 3/1/1/1. Accesses may be overlapped, such that 64 bits of data can be transferred in each direction between the L1 caches (602 and 603) and L2 cache 601 in each clock cycle.

Physically, the L2 cache 601 is split into tag RAM, control and BIST logic, and two instances of a 128 KB data RAM. FIG. 2 illustrates one instance of 128 KB data RAM with some control logic. Other aspects of L2 cache 601 are conventional and suitable implementations will be appreciated by persons of ordinary skill in the art. Each 128 KB data RAM includes eight memory submodules or banks, which each include 1024 columns by 128 rows of memory cells with associated decode, read and write circuits. For a read access, three read address bits are decoded to activate one of eight bank read select pulses at the rising edge of the clock. A read access is performed in the selected bank while the remaining seven banks remain dormant. Write operations are performed in a similar manner, but are triggered by the falling edge of the clock. Read and write operations may access the same or different banks in the same clock cycle.

In an exemplary configuration, each half of each 32-byte block is stored in a separate instance of data RAM. Because tag way-select signals are generated in parallel with the data RAM reads, each data RAM internally reads four 16-byte half-blocks (one for each way). The 4:1 way selection is performed by static CMOS multiplexers just before data reaches the output registers (see e.g., way select multiplexers 141). A two-level sensing scheme is used in the memory array to reduce power dissipation of the 64-byte read data path by 50% while maintaining high speed. At the submodule- or bank-level, primary sense amplifiers drive reduced voltage-swing signals onto differential global bit lines. Separate sets of global bit lines are used to connect the upper and lower groups of four memory banks, which reduces the global bit line capacitance. Redundant submodules 171 and 172 are provided for upper and lower group redundancy, respectively. The arrays within redundant submodules 171, 172 also serve as guard cells for the non-redundant arrays within submodules 114, 110 respectively. The redundant submodules also include primary sense amplifiers. These redundant primary sense amplifiers drive signals that are forwarded into corresponding upper or lower secondary sense amplifiers (361 or 362) to override defective data supplied on the corresponding global bit lines (152 or 153).

A wide variety of computer system configurations are envisioned, each embodying the memory array configurations in accordance with present invention as herein described. For example, one such a computer system includes an integrated circuit realization of processor 600 with on- or off-chip instruction, data and/or predecode caches including a redundant array configured in accordance with the present invention, a memory subsystem (e.g., RAM), a display adapter, disk controller/adapter, various input/output interfaces and adapters, and corresponding external devices. Memory, adapters and interfaces are conventionally coupled to such integrated circuit microprocessor (e.g., via busses).

While the invention has been described with reference to various embodiments, it will be understood that these embodiments are illustrative and that the scope of the invention is not limited to them. Many variations, modifications, additions, and improvements of the embodiments described are possible. For example, although certain embodiments have been described using row redundancy for a plurality of submodules, the invention is not limited to a narrow group of specific array configurations. Indeed, based on the description herein, persons of ordinary skill in the art will appreciate a wide variety of guard cell attributes which the memory cells of one array may provide for another array, and which may be employed without departing from the spirit and scope of the present invention. In particular, the array sizes, widths and topologies; the column, way and submodule selection techniques; and the device configurations and process technologies employed are merely illustrative. Based on the descriptions herein, persons of ordinary skill in the art will appreciate a large number of variations and suitable modifications to the illustrated configurations. Consequently, the scope of the invention, which is defined in the following claims, may well include both the embodiments described as well as other variations, modifications, additions, and improvements.

What is claimed is:

1. A semiconductor integrated circuit comprising:
    a first functional array of memory cells; and
    a second functional array of memory cells positioned adjacent to one edge of the first array;
    wherein the memory cells of the second array also serve as guard cells for the memory cells of the first array along the one edge of the first array.

2. The semiconductor integrated circuit as recited in claim 1 further comprising:
    a plurality of guard cells adjacent to at least one of three remaining edges of the first memory array.

3. The semiconductor integrated circuit as recited in claim 1 wherein the memory cells of the second array are stepped to form, for at least a subset of lithographic layers of the semiconductor process, an unbroken homogeneous lithographic array with the memory cells of the first array.

4. The semiconductor integrated circuit as recited in claim 3 wherein the subset of lithographic layers includes layers which together define transistors within the memory cells.

5. The semiconductor integrated circuit as recited in claim 4 wherein the subset includes at least one polysilicon layer and at least one active area layer.

6. The semiconductor integrated circuit as recited in claim 4 wherein the subset includes all layers below and including a first metal layer.

7. The semiconductor integrated circuit as recited in claim 1 wherein the second array provides redundant memory cells organized as redundant rows for the first array.

8. The semiconductor integrated circuit as recited in claim 7 wherein the second array shares local bit lines in common with the first array.

9. The semiconductor integrated circuit as recited in claim 7 wherein the second array includes local bit lines which are disjoint from local bit lines within the first array.

10. The semiconductor integrated circuit as recited in claim 9 wherein bit line circuits for the local bit lines within the first array are located on an opposite side of the collective first and second arrays as are bit line circuits for the local bit lines within the second array.

11. The semiconductor integrated circuit comprising:

an array of memory cells surrounded on three sides by guard cells;

wherein a group of addressable memory cells located along a fourth side of the array function as guard cells for remaining memory cells of the array.

12. The semiconductor integrated circuit as recited in claim 11 wherein the group of addressable memory cells are organized as redundant rows for the remainder of the array.

13. The semiconductor integrated circuit as recited in claim 12 wherein the group of addressable memory cells share bit lines in common with the remainder of the array.

14. The semiconductor integrated circuit as recited in claim 11 wherein the group of addressable memory cells include bit lines which are disjoint from bit lines within the remainder of the array.

15. The semiconductor integrated circuit as recited in claim 14 wherein bit line circuits for the bit lines serving the group of addressable memory cells is located on an opposite side of the array as are bit line circuits serving the remaining memory cells of the array.

16. The semiconductor integrated circuit as recited in claim 11 wherein the group of addressable memory cells are organized as redundant columns for the remainder of the array.

17. The semiconductor integrated circuit as recited in claim 16 wherein the group of addressable memory cells share word lines in common with the remainder of the array.

18. In a semiconductor integrated circuit, a method of reducing lithographic variation between perimeter memory cells of a memory array and interior memory cells of the array, while reducing required overhead area, said method comprising:

abutting an array of redundant memory cells next to at least one side of the memory array in place of dedicated non-functional sacrificial guard cells.

19. The method as recited in claim 18 wherein:

the array of redundant memory cells provide redundant rows for the array of memory cells.

20. The method as recited in claim 18 further comprising:

allocating redundant memory cells nearer to the memory array before those further away from the memory array.

21. The method as recited in claim 18 further comprising:

abutting an array of guard cells adjacent to three remaining sides of the array of memory cells.

* * * * *